(12) United States Patent
Sharma et al.

(10) Patent No.: US 12,469,767 B2
(45) Date of Patent: Nov. 11, 2025

(54) INTEGRATED PLANAR TRANSISTORS AND MEMORY CELL ARRAY ARCHITECTURES

(71) Applicant: Intel Corporation, Santa Clara, CA (US)

(72) Inventors: Abhishek A. Sharma, Portland, OR (US); Wilfred Gomes, Portland, OR (US)

(73) Assignee: Intel Corporation, Santa Clara, CA (US)

(*) Notice: Subject to any disclaimer, the term of this patent is extended or adjusted under 35 U.S.C. 154(b) by 735 days.

(21) Appl. No.: 17/558,413

(22) Filed: Dec. 21, 2021

(65) Prior Publication Data

US 2023/0197571 A1    Jun. 22, 2023

(51) Int. Cl.

| | | |
|---|---|---|
| *H01L 23/48* | (2006.01) | |
| *H10B 12/00* | (2023.01) | |
| *H10D 62/832* | (2025.01) | |
| *H10D 62/85* | (2025.01) | |
| *H10D 64/01* | (2025.01) | |
| *H10D 64/27* | (2025.01) | |
| *H10D 64/68* | (2025.01) | |

(52) U.S. Cl.
CPC .......... *H01L 23/481* (2013.01); *H10B 12/09* (2023.02); *H10B 12/315* (2023.02); *H10B 12/50* (2023.02); *H10D 62/8325* (2025.01); *H10D 62/8503* (2025.01); *H10D 64/01* (2025.01); *H10D 64/514* (2025.01); *H10D 64/683* (2025.01); *H10D 64/691* (2025.01)

(58) Field of Classification Search
CPC ..... H01L 23/481; H10B 12/09; H10B 12/315; H10B 12/50; H10B 53/40; H10B 12/05; H10D 62/8325; H10D 62/8503; H10D 64/01; H10D 64/514; H10D 64/683; H10D 64/691; H10D 87/00; H10D 88/00
See application file for complete search history.

(56) References Cited

U.S. PATENT DOCUMENTS 12,136,663 B2 *  11/2024  Yamazaki .......... H10D 30/6755
2020/0111908 A1 *  4/2020  Sills .................... H10D 30/6728

* cited by examiner

*Primary Examiner* — David Vu
(74) *Attorney, Agent, or Firm* — Essential Patents Group, LLP

(57) ABSTRACT

Memory device architectures including integrated high voltage planar transistor support circuitry underlying memory cell arrays are discussed related to improving density and device performance Such memory device architectures include planar transistors having wide band gap channel materials integrated with memory cell arrays using a number of metallization layers. The metallization layers between the planar transistors and the memory cells are predominantly tungsten and the metallization layers in which the memory cells are embedded are predominantly a metal other than tungsten.

23 Claims, 9 Drawing Sheets ns. For example, one layer disposed over or under
INTEGRATED PLANAR TRANSISTORS AND MEMORY CELL ARRAY ARCHITECTURES

BACKGROUND

Demand for integrated circuits (ICs) in portable electronic applications has motivated higher levels of semiconductor device performance and integration. For example, devices demand memory solutions that use lower power, perform read and write operations more quickly, and offer improved reliability. Furthermore, ever more compact memory architectures are desirable. Embedded memory may be integrated with a host integrated circuit as a multi-chip module (MCM) or may be monolithically integrated with a host IC (i.e., both memory and the host IC fabricated on the same chip). For embedded memory applications, reducing the overall memory array footprint helps achieve larger memories and reduced device cost. It is with respect to these and other considerations that the present improvements have been needed. Such improvements may become critical as increased memory performance is needed to drive higher performance integrated circuit electronic devices.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
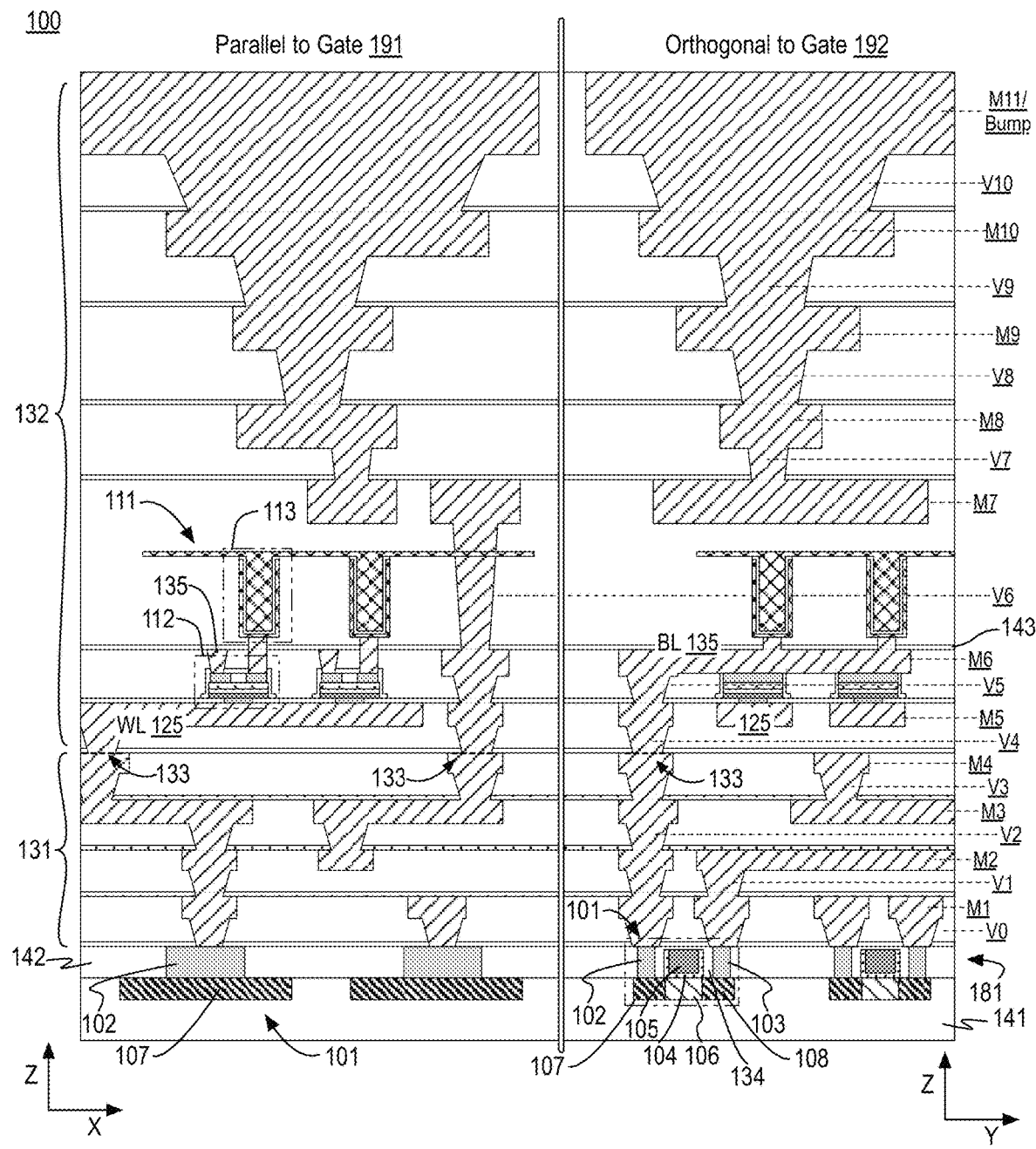
FIG. 1 provides two cross-sectional views of an exemplary memory device having an integrated planar transistor underlying an array of memory cells.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direct contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. The terms "lateral", "laterally adjacent" and similar terms indicate two or more components are aligned along a plane orthogonal to a vertical direction of an overall structure. Herein, the term "predominantly" indicates not less than 50% of a particular material or component while the term "substantially pure" indicates not less than 99% of the particular material or component. Unless otherwise indicated, such material percentages are based on atomic percentage. As used herein, the terms "monolithic", "monolithically integrated", and similar terms indicate the components of the monolithic overall structure form a indivisible whole not reasonably capable of being separated.

Herein, the term planar transistor indicates a transistor having a channel structure that interfaces with a gate electrode (i.e., with an intervening gate dielectric layer therebetween) only along a planar surface of the channel structure. Notably, in a planar transistor, the channel structure does not interface with the gate electrode at sidewalls of the channel structure (as with fin based and nanowire based transistors and similar structures. The term band gap is used in its ordinary meaning as a characteristic of a material defined as an energy range where no electron states can exist. Typically, wider band gap materials allow transistor devices to operate at higher voltages and may allow transistor devices to operate at higher frequencies and/or temperatures.

Memory architectures and related support transistor circuitry structures are described herein related to providing planar high voltage support transistors under an array of memory cells each including a transistor and a capacitor.

As discussed, it is desirable to increase memory density and to improve memory device performance in terms of power usage, read and write operation speed, and reliability. In some embodiments, a memory device includes a number planar transistors of underlying support circuitry each including a channel structure, a gate electrode, and a gate dielectric layer between the channel structure and the gate electrode with the channel structure using a material having a high band gap such as a band gap of not less than 2 eV. An array of memory cells are over and coupled to the planar transistor such that each of the memory cells includes a transistor and a capacitor. For example, the transistor may be a laterally aligned back gated thin film transistor (TFT) and the capacitor may be a vertically aligned metal-insulator-metal (MIM) capacitor. A number of first metallization layers are between the planar transistor and the memory cell such that the first metallization layers predominately include tungsten and a number of second metallization layers are over and laterally adjacent the memory cell such that the second metallization layers predominately include a metal other than tungsten such as copper.

Thereby, a back end of line (BEOL) memory array is provided within a full metallization stack with support circuitry (i.e., timing circuitry, IO circuitry, mid-logic circuitry, driver circuitry, etc.) provided under the memory array. Such support or control circuitry is advantageously made up of planar transistors having high band gap channel materials. Such planar transistors provide a variety of advantages including simpler, less costly manufacturing, support for higher voltage operation and deployment of wide band gap materials to attain sufficient carriers for device conductivity during activation. Memory devices include one or more arrays in which individual memory cells include a select transistor and a capacitor to provide a 1T-1C architecture.

FIG. 1 provides two cross-sectional views of an exemplary memory device 100 having an integrated planar transistor underlying an array of memory cells, arranged in accordance with at least some implementations of the present disclosure. On the left of FIG. 1 (and of FIGS. 6-10), a parallel to gate view 191 is provided such that parallel to the gate refers to the gate of a select transistor 112. On the right of FIG. 1, an orthogonal to gate view 192 is provided such that, again, orthogonal to the gate refers to the gate of a select transistor 112. Such views are divided by a vertical line to indicate they are separate views and are not a continuous view of memory device 100.

As shown, memory device 100 includes a substrate 141, which may have a lateral surface along the x-y plane. Such lateral surface may be taken at any vertical position of substrate 141 such as a top surface of substrate 141, or at any vertical position of memory device 100. The lateral surface of the x-y plane is orthogonal to a vertical or build up dimension as defined by the z-axis. Substrate 141 may be any material known to be suitable for the fabrication of transistor circuitry. In the illustrated example, a planar transistor 101 is formed partially within substrate 141. In other examples, planar transistor 101 is formed over or on substrate 141. For example, substrate 141 may provide a suitable material for the formation of a high voltage planar transistor 101 at least partially therein or it may provide a suitable surface to use as a host for the formation of planar transistor 101 thereon. For example, substrate 141 may be silicon, an silicon on insulator substrate, or any other host material. Substrate 141 may include additional device layer(s), metallization stack(s), or the like.

Memory device 100 as illustrated in FIG. 1, represents a portion of a monolithic integrated circuit including support circuitry 181 fabricated over and/or on substrate 141. Support circuitry 181 (or control circuitry) includes a number of planar transistors 101 that employ a wide band gap semiconductor channel structure 106. Channel structure 106 may also be characterized as channel material or, simply, a channel. As shown, planar transistors 101 each include channel structure 106 between source and drain structures 107, 108 (e.g., source and drain semiconductors). Planar transistors 101 each further include source and drain contacts 102, 103 to in contact with source and drain structures 107, 108 and a gate structure including a gate electrode 105 and a gate dielectric layer 104. At least a portion of gate dielectric layer 104 is on at least a portion of channel structure 106 and between channel structure 106 and gate electrode 105, such that gate electrode 105 may control channel structure 106 during operation. In the examples herein, gate dielectric layer 104 is on a bottom and sidewalls of gate electrode 105. In other embodiments, gate dielectric layer 104 is only on a bottom of gate electrode 105 but is absent sidewalls of gate electrode 105. Optional dielectric spacers 134 may be provided between the gate structure and each of source and drain contacts 102, 103. As shown, support circuitry 181 and overlying metallization layers 131, 132 are embedded within dielectric material layers 142, 143.

A number of memory cells 111 are over and coupled to planar transistors 101 of support circuitry 181. Each of memory cells 111 includes a select transistor 112 and a capacitor 113, which are discussed further herein below. Memory cells 111 are arrayed in the x-y plane in a grid or similar pattern such that particular ones of memory cells 111 are coupled to word lines 125 and bit lines 135. Each of word lines 125 extends, for example, in the x-direction, and is coupled to a number of gate electrodes of corresponding select transistors 112 (see FIG. 2). Each of bit lines 135 extends, for example, in the y-direction, and is coupled to a number of source contacts of other ones of select transistors 112 (see FIG. 2). Each of memory cells 111 includes a capacitor 113 coupled to a drain contact of its corresponding select transistor 112 such that a 1T-1C architecture is achieved with each select transistor contacted at a gate electrode by a word line, at a source electrode by a bit line, and a drain electrode by a capacitor.

Planar transistors 101, memory cells 111 and routing to an outside device (not shown), is provided by metallization layers 131, 132. As used herein, the term metallization layer indicates metal interconnections or wires that provide electrical routing. Adjacent metallization layers are interconnected by vias that may be characterized as part of the metallization layers or between the metallization layers. As shown, in some embodiments, first metallization layers 131 (lower metallization layers) are formed over and immediately adjacent planar transistors 101 and second metallization layers 132 (higher metallization layers) are formed over and first metallization layers 131 such that some of second metallization layers 132 are laterally adjacent memory cells 111. For example, memory cells 111 are within the stack of second metallization layers 132. Such architectures provide for close integration of support circuitry 181 and the array of memory cells 111.

Notably, one or more of second metallization layers 132 are laterally aligned with at least portions of memory cells 111 while others of second metallization layers 132 are over (e.g., vertically aligned with memory cells 111. Furthermore, all of first metallization layers 131 are between planar transistors 101 and memory cells 111 such that none of first metallization layers 131 are below planar transistors 101 or over memory cells 111. Notably, one or two of second metallization layers 132 may be between planar transistors 101 and memory cells 111. In the illustrated example, one of second metallization layers 132 (M5) is between planar transistors 101 or over memory cells 111 with M5 being immediately below in contact with the back gate of select transistors 112. For example, M5 provides word line 125 and, optionally, other interconnects of memory device 100. Furthermore, another one of second metallization layers 132 (M6) is over planar transistors 101 and below capacitors 113 with M6 being in contact with the source gate of select transistors 112. For example, M6 provides bit line 135 and, optionally, other interconnects of memory device 100.

In the illustrated example, first metallization layers 131 include V0, M1, V1, M2, V2, M3, V3, and M4 (i.e., four metallization layers and corresponding via layers). However, first metallization layers 131 may include any number of metallization layers such as two metallization layers, three metallization layers, five metallization layers, or more.

Similarly, second metallization layers 132 include V4, M5, V5, M6, V6, M7, V7, M8, V8, M9, V9, M10, V10, and M11 (e.g., a bump or pad layer) such that second metallization layers 132 include seven metallization layers and corresponding via layers. However, second metallization layers 132 may include any number of metallization layers such as four metallization layers, five metallization layers, six metallization layers, or more than seven metallization layers.

As discussed, the architecture of memory device 100 inclusive of high voltage planar transistors 101 and memory cells 111 embedded in second metallization layers 132 advantageously provides an efficient and compact monolithic memory solution. Notably, the material of channel structures 106 of planar transistors 101 may be advantageously selected to provide a high voltage transistor devices. Such high voltage planar transistor devices offer advantages including manufacturability, support for high voltage operation, and sufficient carriers for operation of memory device 100. Furthermore, the material deployed as gate dielectric 104 as well as the thickness of the material between channel structure 106 and gate electrode 105 may provide for the capability of planar transistors 101 to provide high voltage operation.

Figure 2:
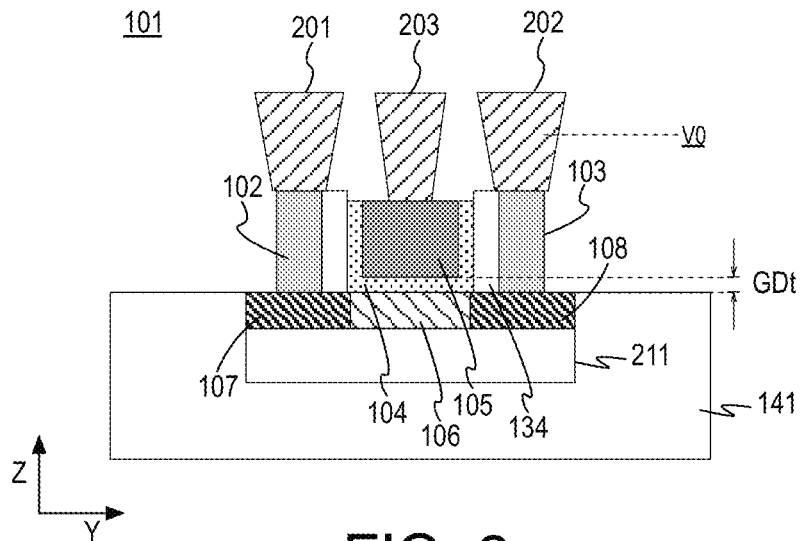
FIG. 2 illustrates an exemplary high voltage planar transistor for use in underlying support circuitry.

FIG. 2 illustrates an exemplary high voltage planar transistor 101 for use in underlying support circuitry 181, arranged in accordance with at least some implementations of the present disclosure. In FIG. 2, planar transistor 101 is illustrated in orthogonal to gate view 192 for the sake of clarity of presentation. Planar transistor 101, as discussed, includes wide band gap semiconductor channel structure 106 between source and drain structures 107, 108. Channel structure 106 and source and drain structures 107, 108 may be formed in a doped well 211 of substrate 141 in accordance with some embodiments. In other embodiments, channel structure 106 and/or source and drain structures 107, 108 may be deployed on substrate 141. For example, epitaxial growth techniques, may be used to form one or more of channel structure 106 and/or source and drain structures 107, 108 from a seed layer provided by substrate 141 or on substrate. Source and drain structures 107, 108 are contacted by source and drain contacts 102, 103. Source and drain contacts 102, 103 are contacted by conductive vias 201, 202, respectively. Gate electrode 105 is contacted by conductive via 203. Conductive vias 201, 202, 203 are part of V0 of first metallization layers 131.

As used herein, the term wide band gap material indicates a material having a band gap greater than that of conventional semiconductors such as silicon, with such conventional semiconductors typically having a band gap in the range of 1 to 1.5 eV. In some embodiments, channel structure 106 is a material having a band gap greater than 1.5 eV. However, even greater band gap materials may be advantageously deployed in channel structure 106. In some embodiments, channel structure 106 is a material having a band gap greater than 2.0 eV. In some embodiments, channel structure 106 is a material having a band gap greater than 2.5 eV. In some embodiments, channel structure 106 is a material having a band gap greater than 3.0 eV.

In some embodiments, channel structure 106 includes gallium and nitrogen (e.g., gallium nitride). In some embodiments, channel structure 106 includes silicon and carbon (e.g., silicon carbide). In some embodiments, channel structure 106 includes a high mobility oxide semiconductor material, such as tin oxide (e.g., tin and oxygen), antimony oxide (e.g., antimony and oxygen), indium oxide (e.g., indium and oxygen), indium tin oxide (e.g., indium, tin, and oxygen), titanium oxide (e.g., titanium and oxygen), zinc oxide (e.g., zinc and oxygen), indium zinc oxide (e.g., indium, zinc, and oxygen), indium gallium zinc oxide (e.g., indium, gallium, zinc, and oxygen, IGZO), gallium oxide (e.g., gallium and oxygen), titanium oxynitride (e.g., titanium, oxygen, and nitrogen), ruthenium oxide (e.g., ruthenium and oxygen), or tungsten oxide (e.g., tungsten and oxygen). In general, the channel material 106 may include one or more of tin oxide, cobalt oxide (e.g., cobalt and oxygen), copper oxide (e.g., copper and oxygen), antimony oxide, ruthenium oxide, tungsten oxide, zinc oxide, gallium oxide, titanium oxide, indium oxide, titanium oxynitride, indium tin oxide, indium zinc oxide, nickel oxide (e.g., nickel and oxygen), niobium oxide (e.g., niobium and oxygen), copper peroxide (e.g., copper and oxygen), IGZO, indium telluride (e.g., indium and tellurium), molybdenite (e.g., molybdenum and sulfur), molybdenum diselenide (e.g., molybdenum and selenium), tungsten diselenide (e.g., tungsten and selenium), tungsten disulfide (e.g., tungsten and sulfur), indium gallium arsenide (e.g., indium, gallium, and arsenic), gallium nitride (e.g., gallium and nitrogen), aluminum gallium nitride (e.g., aluminum, gallium, and nitrogen), indium phosphite (e.g., indium and phosphorous), and black phosphorus, each of which may possibly be doped with one or more of gallium, indium, aluminum, fluorine, boron, phosphorus, arsenic, nitrogen, tantalum, tungsten, and magnesium, etc.

Furthermore, gate dielectric layer 104 may be a material at a particular thickness, GDt, between channel structure 106 and gate electrode 105 that enables high voltage operation of memory device 100. In some embodiments, gate dielectric layer 104 is a relatively thick layer of a material including silicon and oxygen (e.g., silicon oxide, $SiO_2$) In addition to silicon and oxygen, gate dielectric layer 104 may include nitrogen (e.g., silicon oxynitride) or carbon (e.g., silicon oxycarbide). In some embodiments, gate dielectric layer 104 is a multilayer stack of alternating dielectric materials (of the same or differing thicknesses). In some embodiments, the multilayer stack includes alternating layers of a first layer including silicon and oxygen (e.g., silicon oxide) and a second layer including one of hafnium or zirconium and oxygen (e.g., hafnium oxide or zirconium oxide). Other dielectric materials may be used.

In some embodiments, the thickness, GDt, between channel structure 106 and gate electrode 105 is not less than 50 nm. In some embodiments, GDt is in the range of 50 nm to 1,000 nm (i.e., not less than 50 nm and not more than 1,000 nm). In some embodiments, GDt is not less than 75 nm. In some embodiments, GDt is not less than 100 nm. In some embodiments, GDt is not less than 200 nm. In some embodiments, GDt is not less than 500 nm. Other thickness may be used.

Returning to FIG. 1, in addition or in the alternative, the materials of first metallization layers 131 and second metallization layers 132 may be selected to provide ease of manufacturability, low cost, and high performance of memory device 100. In some embodiments, interface 133 between first metallization layers 131 and second metallization layers 132 may differentiate between the materials of first metallization layers 131 and second metallization layers 132. In some embodiments, first metallization layers 131 are predominantly tungsten. As used herein, when applied to multiple layers, a proportion or percentage of material applies to each of the multiple layers. Notably, an entirety of first metallization layers 131 or a bulk fill metal of first metallization layers 131 may be substantially pure tungsten. In some embodiments, one or more of first metallization layers 131 include a liner material (e.g., tantalum, tantalum nitride, etc.) and the tungsten is deposited within the liner material. In some embodiments, the vias corresponding to first metallization layers 131 are also predominately tungsten. In some embodiments, first metallization layers 131 are greater than 50% tungsten. In some embodiments, first metallization layers 131 are not less than 90% tungsten. In some embodiments, the entirety of first metallization layers 131 or a fill metal of first metallization layers 131 (i.e., within a liner, not shown) is not less than 99% tungsten.

Furthermore, above interface 133, second metallization layers 132 are a metal other than tungsten. In some embodiments, the metal other than tungsten is copper. In some embodiments, second metallization layers 132 are predominantly copper. Notably, an entirety of second metallization layers 132 or a bulk fill metal of second metallization layers 132 may be substantially pure tungsten. In some embodiments, second metallization layers 132 may include a liner material (e.g., tantalum nitride, tungsten nitride, etc.) and the copper is deposited within the liner material. In some embodiments, the vias corresponding to second metallization layers 132 are also predominately copper. In some embodiments, second metallization layers 132 are greater than 50% copper. In some embodiments, second metallization layers 132 are not less than 90% copper. In some embodiments, the entirety of second metallization layers 132 or a fill metal of second metallization layers 132 (i.e., within a liner, not shown) is not less than 99% copper.

As discussed, an array of memory cells 111 may be provided in a pattern such as a grid (i.e., in the x-plane) over support circuitry 181. Each of memory cells 111 includes a select transistor and a capacitor.

Figure 3:
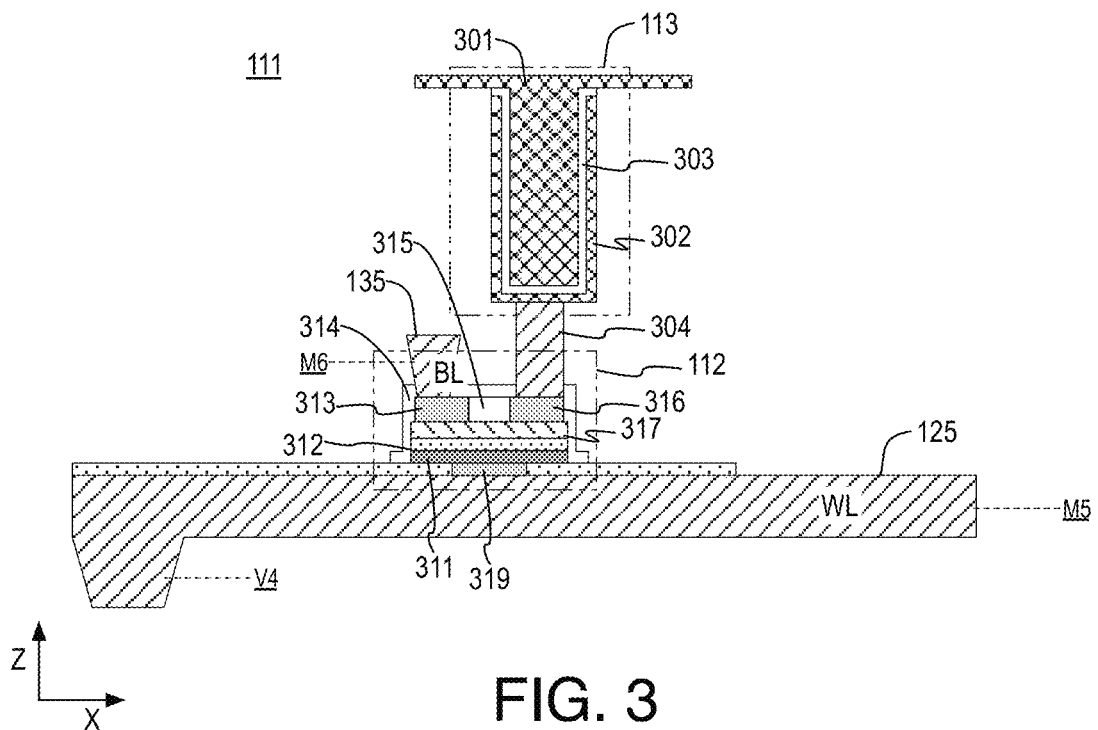
FIG. 3 illustrates an exemplary memory cell provided over support circuitry including high voltage planar transistors.

FIG. 3 illustrates an exemplary memory cell 111 provided over support circuitry including high voltage planar transistors, arranged in accordance with at least some implementations of the present disclosure. In FIG. 3, memory cell 111 is illustrated in parallel to gate view 191 for the sake of clarity of presentation.

As shown, each select transistor 112 includes a semiconductor channel layer 317. Channel layer 317 may be any suitable semiconductor material such as an amorphous (i.e., having no structural order) film or a polycrystalline (i.e., having micro-scale to nano-scale crystal grains) film. In some embodiments, select transistor 112 may be characterized as a thin film transistor (TFT). Select transistors 112 may deploy any suitable thin film semiconductor material for channel layer 317 including group IV semiconductor materials such as silicon (Si), germanium (Ge), and SiGe alloys, or an oxide semiconductor. An oxide semiconductor is a semiconducting oxide, or a semiconductor comprising oxygen, which may provide a wide band gap material having low leakage. For example, the metal oxide may include at least one of Mg, Cu, Zn, Sn, Ti, Ni, Ga, In, Sb, Sr, Cr, Co, V, or Mo. The metal oxides may be suboxides ($A_2O$), monoxides (AO), binary oxides ($AO_2$), ternary oxides ($ABO_3$), and mixtures thereof.

Each select transistor include a gate electrode 311 (e.g., metal gate) separated from channel layer 317 by a gate dielectric 312. Gate electrode 311 is connected to word line 125 by a word line to metal gate via 319. In the exemplary embodiments herein, select transistors 112 are back gate devices with gate dielectric 312 fabricated over gate electrode 311. A dielectric spacer 315 separates source and drain contacts 313, 316, which contact a top surface of channel layer 317. A source contact 313 is coupled to bit line 135 (i.e., part of M6 of second metallization layers 132) and a drain contact 316 is coupled to a local interconnect 304, which is also connected to an outer plate 302 of capacitor 113. Source and drain contacts 313, 316 are separated by a dielectric spacer 315. A conformal dielectric layer 314 may protect portions of select transistor 112.

Capacitor 113 (e.g., a storage capacitor) includes outer plate 302 (or terminal) and inner plate 301 (or terminal) separated by a dielectric layer 303 such that outer plate 302 is electrically coupled drain contact 316 (i.e., a semiconductor terminal) of select transistor 112. Inner plate 301 (or second terminal) of capacitor 113 may be connected to another circuit node as provide by V6/M7 of second metallization layers 132. Inner and outer plates 301, 302 may be any suitable conductive materials such as such as a metal (e.g., copper, cobalt, tungsten, titanium, aluminum, ruthenium, etc.). Dielectric layer 303 may be any dielectric material having a suitable relative permittivity. For example, dielectric layer 303 may be silicon oxide, aluminum oxide, or a high-k dielectric, such as hafnium oxide. More generally, dielectric layer 303 may include elements such as hafnium, silicon, oxygen, titanium, tantalum, lanthanum, aluminum, zirconium, barium, strontium, yttrium, lead, scandium, niobium, and zinc. Examples of materials that may be used in dielectric layer 303 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, dielectric layer 303 may be a multi-layer gate dielectric including multiple different materials.

In some embodiments, layer 303 is a ferroelectric material. As used herein, the term ferroelectric material indicates a material that has a spontaneous electric polarization that may be controlled by the application of an external electric field. In some embodiments, layer 303 includes lead, zirconium, titanium, and oxygen (e.g., lead zirconium titanate, $Pb[Zr_xTi_{1-x}]O_3$). In some embodiments, layer 303 includes barium, titanium, and oxygen (e.g., barium titanate, $BaTiO_3$). In some embodiments, layer 303 includes lead, titanium, and oxygen (e.g., lead titanate, $PbTiO_3$). In some embodiments, layer 303 includes barium, strontium, titanium, and oxygen (e.g., barium strontium titanate, $BaSrTiO_3$). Other ferroelectric materials may be employed.

With reference to FIG. 1, memory device 100 includes support circuitry 181 including a number of planar field effect transistors (FETs) (planar transistors 101) such that individual ones of planar transistors 101 include channel structure 106, gate electrode 105, and gate dielectric layer 104 between channel structure 106 and gate electrode 105 such that channel structure 106 includes a material having a band gap of, for example, not less than 2 eV. Other embodiments may deploy channel structure 106 having a band gap of, for example, not less than 3 eV. Other band gap materials may be used. Memory device 100 also includes an array of memory cells 111 over and monolithically integrated with peripheral support circuitry 181 via, at least in part, a number of metallization layers 131, 132 such that individual ones of memory cells 111 include a select transistor 112 and a capacitor 113. Metallization layers 131, 132 include first metallization layers 131 between planar transistors 101 and the array of memory cells 111 and second metallization layers 132 over and laterally adjacent the array of memory cells 111 such that each metallization layer of first metallization layers 131 predominately comprise tungsten and each metallization layer of second metallization layers 132 predominately comprises a metal other that tungsten, such as copper. In some embodiments, each metallization layer of first metallization layers 131 comprise not less than 90% tungsten and each metallization layer of second metallization layers 132 comprise not less than 90% copper. Notably, a first metallization structure (i.e., word line 125) of second metallization layers 132 is between planar transistors 101 and select transistor 112 such that the first metallization structure is also predominately a metal other that tungsten, such as copper. Furthermore, a second metallization structure (i.e., bit line 135) of second metallization layers 132 is over select transistor 112 such that the second metallization structure is also predominately a metal other that tungsten.

Support circuitry 181 may include any pertinent support or control circuitry for the array of memory cells 111. Support circuitry 181 may be partially or fully under the array of memory cells 111.

Figure 4:
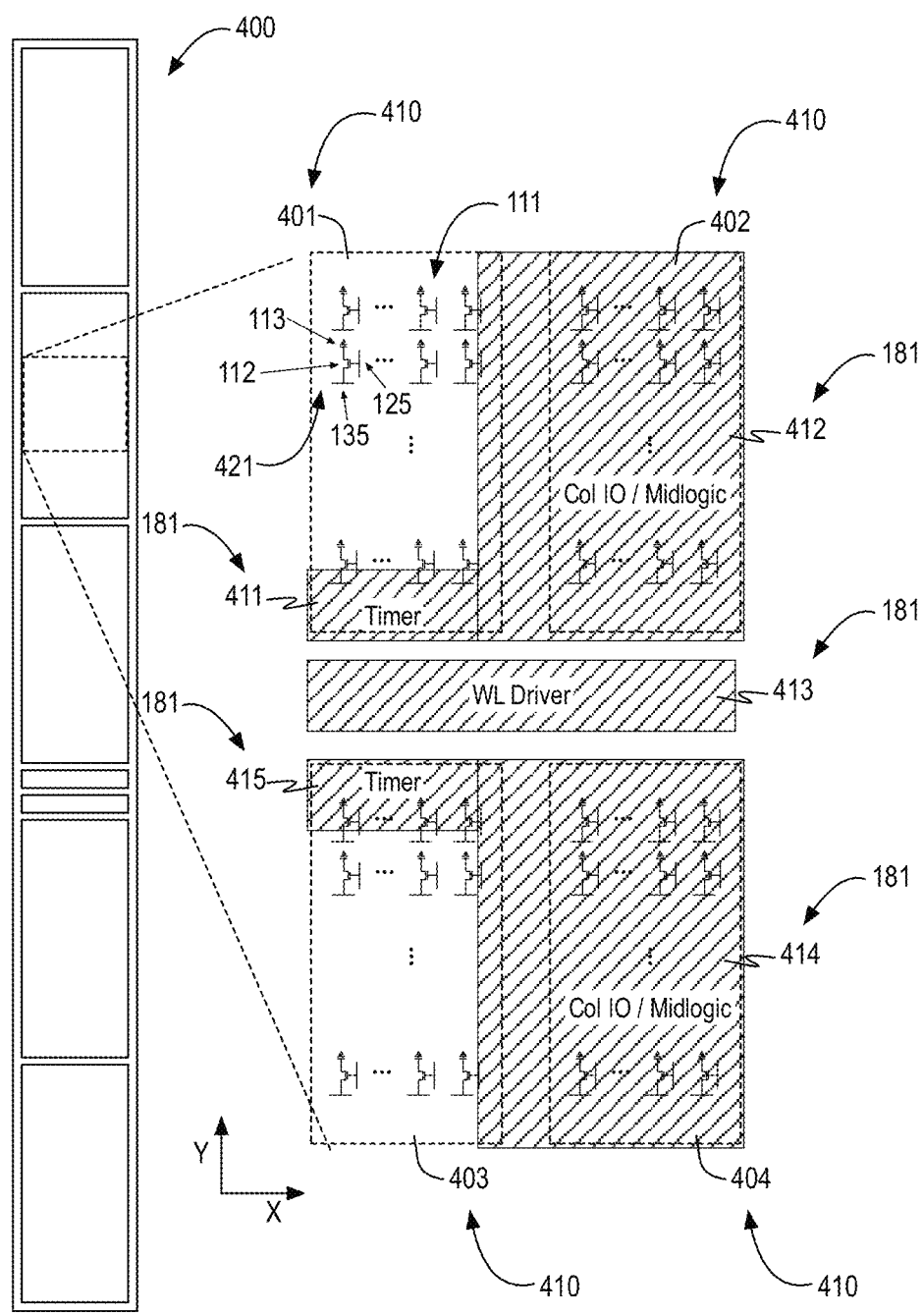
FIG. 4 illustrates an exemplary integrated memory device including one or more arrays of memory cells provided over support circuitry including high voltage planar transistors.

FIG. 4 illustrates an exemplary integrated memory device 400 including one or more arrays of memory cells provided over support circuitry including high voltage planar transistors, arranged in accordance with at least some implementations of the present disclosure. As shown in FIG. 4, integrated memory device 400 is provided as a monolithic device that may be deployed as part of a memory module, as a component in a computing device, or the like. The computing device may be any device or system such as a server, a personal computer, a laptop computer, a tablet, a phablet, a smart phone, a digital camera, a gaming console, a wearable device, a display device, an all-in-one device, a two-in-one device, or the like. For example, as used herein, a system, device, computer, or computing device may include any such device or platform.

In the illustrated example, memory segments or caches 401, 402, 403, 404 each includes an array 410 of memory cells 111. Each of memory segments 401, 402, 403, 404 are illustrated with hatched perimeter lines and a number of memory cells 111 arrayed therein. Each of memory cells 111 includes a select transistor 112 and a capacitor 113, and each of memory cells 111 is connected to a word line 125 and a bit line 135 as shown with respect to exemplary memory cell 421. Such memory cells 111 are arrayed in, for example, a grid pattern in the x-y plane. With reference to FIG. 1, memory cells 111 are over first metallization layers 131 and at least partially embedded in second metallization layers 132, with metallization layers 131, 132 integrating memory segments 401, 402, 403, 404 and underlying support circuitry 411, 412, 413, 414, 415 and providing connection to the system in which memory device 400 is being deployed.

For example, support or control circuitry 411, 412, 413, 414, 415 is illustrated with a solid perimeter line an hatching. Notably, at least portions of support circuitry 411, 412, 413, 414, 415 are under portions of memory segments 401, 402, 403, 404 such that support circuitry 411, 412, 413, 414, 415 and memory segments 401, 402, 403, 404 are stacked in the z-direction as discussed herein. For example, at least portions of memory segments 401, 402, 403, 404 are in the positive z-direction with respect to pertinent portions of support circuitry 411, 412, 413, 414, 415. As shown with respect to memory segments 401, 403, portions or an entirety of any of memory segments 401, 402, 403, 404 may not have underlying support circuitry. Similarly, as shown with respect to support circuitry 413, portions or an entirety of any of support circuitry 411, 412, 413, 414, 415 may not have overlying memory cells. Routing between such memory segments 401, 402, 403, 404 and support circuitry 411, 412, 413, 414, 415 is provided via metallization layers 131, 132.

In the example of FIG. 4, memory device 400 includes support circuitry 411, 412, 413, 414, 415 inclusive of timer circuitry, as implemented by support circuitry 411, 415, column input/output (IO) circuitry, as implemented by support circuitry 412, 414, mid-logic circuitry, as implemented by support circuitry 412, 414, and word line driver circuitry, as implemented by support circuitry 413. However, support circuitry 411, 412, 413, 414, 415 may provide any support or control functions for memory device 400 and such functionality may be implemented in any suitable architecture.

Figure 5:
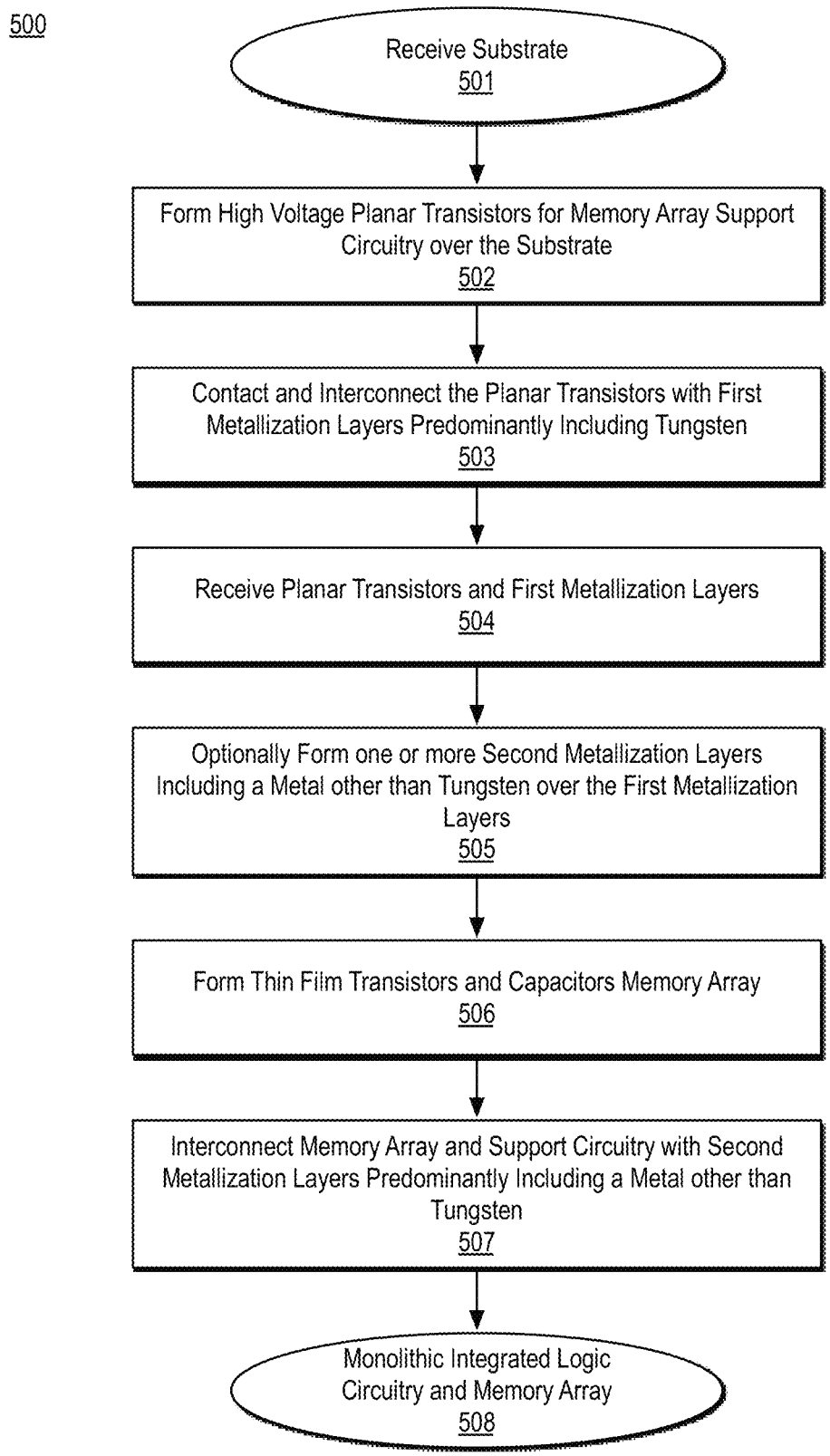
FIG. 5 illustrates a flow diagram illustrating an example process for fabricating memory device structures.

FIG. 5 illustrates a flow diagram illustrating an example process 500 for fabricating memory device structures, arranged in accordance with at least some implementations of the present disclosure. For example, process 500 may be implemented to fabricate memory device 100 or any other memory device structure discussed herein. In the illustrated embodiment, process 500 includes one or more operations as illustrated by operations 501-508. However, embodiments herein may include additional operations, certain operations being omitted, or operations being performed out of the order provided. In an embodiment, process 500 may fabricate memory device 100 as discussed further herein with respect to FIGS. 6-10.

Process 500 begins at operation 501, where a substrate is received for processing. The substrate may include a wide band gap semiconductor layer, upon which planar transistors may be formed. Alternatively, the substrate may advantageously include a work surface on which such high voltage planar transistors are formed.

Processing continues at operation 502, where high voltage planar transistors for memory array support circuitry are formed over the substrate. The planar transistors may be formed using any suitable technique or techniques known in the art. In some examples, both n-type and p-type planar transistors are fabricated at operation 502 for eventual interconnection into CMOS support or control circuitry.

Processing continues at operation 503, where the planar transistors formed at operation 502 are at least partially interconnected with first metallization layers that predominantly include tungsten. In some embodiments, the first metallization layers include four metallization layers (M1-M4) and corresponding via structures. Such via structures may also be predominantly tungsten. In some embodiments, the first metallization layers are not less than 90% tungsten. In some embodiments, the first metallization layers or the portions of the first metallization layers within an optional liner are not less than 99% tungsten (e.g., substantially pure tungsten).

Processing continues at operation 504, where the planar transistors and first metallization layers are received for further processing. In some embodiments, the planar transistors and first metallization operations may be performed as front end of line (FEOL) processing and continued processing may be performed as back end of line (BEOL) processing inclusive of forming BEOL metallization and embedded memory cells each inclusive of a select transistor and a corresponding capacitor.

Processing continues at operation 505, where one or more second metallization layers may be formed such that the one or more second metallization layers are predominantly a metal other than tungsten. For example, vias and a metallization layer including word lines for the memory cells may be formed of predominantly a metal other than tungsten. In some embodiments, the metal other than tungsten is copper. In some embodiments, the metallization layer(s) formed at operation 505 are predominantly copper. In some embodiments, the metallization layer(s) formed at operation 505 are not less than 90% copper. In some embodiments, the metallization layer(s) or the portions of the metallization layer(s) formed at operation 505 within an optional liner are not less than 99% copper (e.g., substantially pure tungsten). Notably, it advantageous to have the metallization layer inclusive of the word line and subsequent metallization layers be a metal other than tungsten, such as copper.

Processing continues at operation 506, where the select transistors and capacitors (e.g., thin film transistors and MIM capacitors memory array is formed). It is noted that operations 506, 507 may be combined in part such that the formation of the select transistors and capacitors and at least portions of the laterally adjacent metallization layers are formed in parallel and in shared operations. The select transistors and capacitors may be formed using any suitable technique or techniques. As discussed herein, the select transistors and capacitors are fabricated within BEOL metallization layers that are predominantly a metal other than tungsten, such as copper. In some embodiments, the select transistors are fabricated in a metallization layer over the support circuitry and the MIM capacitors are fabricated in a metallization layer over the select transistors. In some embodiments, the select transistors are interconnected to the capacitors and adjacent circuitry with vias and traces fabricated at these same metallization layers to form a memory array.

Processing continues at operation 507, where second metallization layers are formed such that the second metallization layers are predominantly a metal other than tungsten. For example, vias and a metallization layer including interconnect traces for the memory cells and support circuitry, as well as to couple the memory device to the system in which it is being deployed, may be formed of predominantly a metal other than tungsten. In some embodiments, the metal other than tungsten is copper. In some embodiments, the second metallization layers formed at operation 507 are predominantly copper. In some embodiments, the second metallization layers formed at operation 507 are not less than 90% copper. In some embodiments, the second metallization layers or the portions of the second metallization layers formed at operation 507 within an optional liner are not less than 99% copper (e.g., substantially pure tungsten).

Processing continues at operation 508, where the fabricated monolithic integrated logic circuitry and memory array formed via operations 501-507 is output. The monolithic integrated logic circuitry may be further processed and/or packaged in preparation for insertion in a final system or device. As discussed, the memory device formed via process 500 may integrated into any suitable electronics device.

FIGS. 6, 7, 8, 9, and 10 illustrate cross-sectional side views of example memory device structures as particular fabrication operations are performed, arranged in accordance with at least some implementations of the present disclosure. On the left of FIGS. 6-10, a parallel to gate view 191 is provided such that parallel to the gate refers to the gate of eventual select transistor 112 (see FIG. 9). On the right of FIGS. 6-10, an orthogonal to gate view 192 is provided such that orthogonal to the gate refers to the gate of a select transistor 112. Such views are divided by a vertical line to indicate they are separate views and are not a continuous view of memory device 100.

Figure 6:
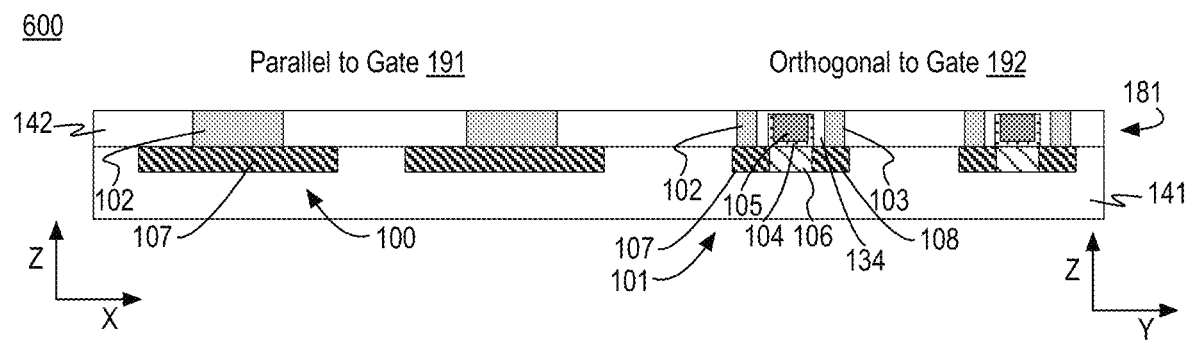
FIGS. 6, 7, 8, 9, and 10 illustrate cross-sectional side views of example memory device structures as particular fabrication operations are performed.

As shown in FIG. 6, substrate 141 may be received for processing (operation 501) and support circuitry 181 inclusive of high voltage planar transistors 101 are formed on and/or over substrate 141 to fabricate a memory structure 600. As discussed herein, planar transistor 101 include wide band gap semiconductor channel structures 106 between source and drain structures 107, 108. Channel structure 106 and source and drain structures 107, 108 may be formed in a doped well of substrate 141 or they may be formed within and/or over substrate 141. Channel structures 106 include any wide band gap materials discussed herein. Source and drain contacts 102, 103 are on source and drain structures 107, 108 and separated from a gate structure (inclusive of gate electrode 105 and gate dielectric layer 104) by optional dielectric spacers 134. Gate electrode 105 may include any suitable material such as a metal or highly doped material. For example, gate electrode 105 may be or include ruthenium, palladium, platinum, cobalt, nickel, conductive metal oxides, hafnium, zirconium, titanium, tantalum, aluminum, alloys of these metals, carbides of these metals, or others. High voltage planar transistors 101 may be formed using any suitable technique or techniques such as deposition techniques, patterning (e.g., lithography and etch) techniques, implant techniques, planarization techniques, epitaxial growth techniques, and so on.

Figure 7:
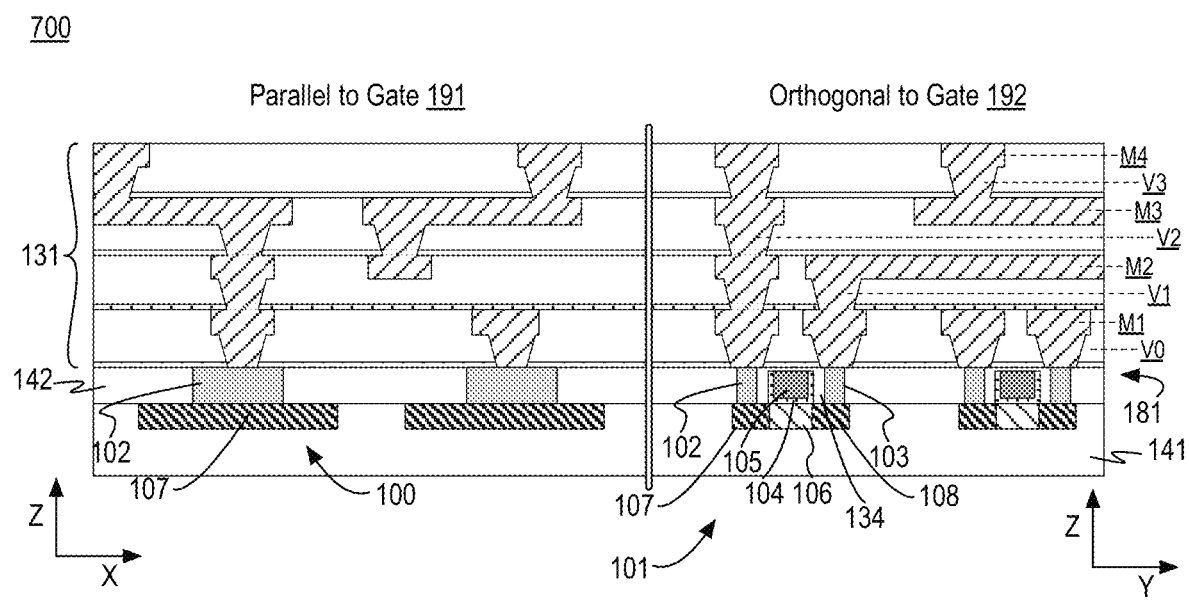

FIG. 7 illustrates a memory structure 700 similar to memory structure 600 after the formation of first metallization layers 131. As discussed, first metallization layers 131 are advantageously predominantly tungsten. First metallization layers 131 may be formed using any suitable technique or techniques such as single or dual damascene techniques or the like. In some embodiments, first metallization layers 131 are not less than 90% tungsten. In some embodiments, the entirety of first metallization layers 131 or a fill metal of first metallization layers 131 (i.e., within a liner, not shown) is not less than 99% tungsten. The vias corresponding to first metallization layers 131 may be the same materials.

Figure 8:
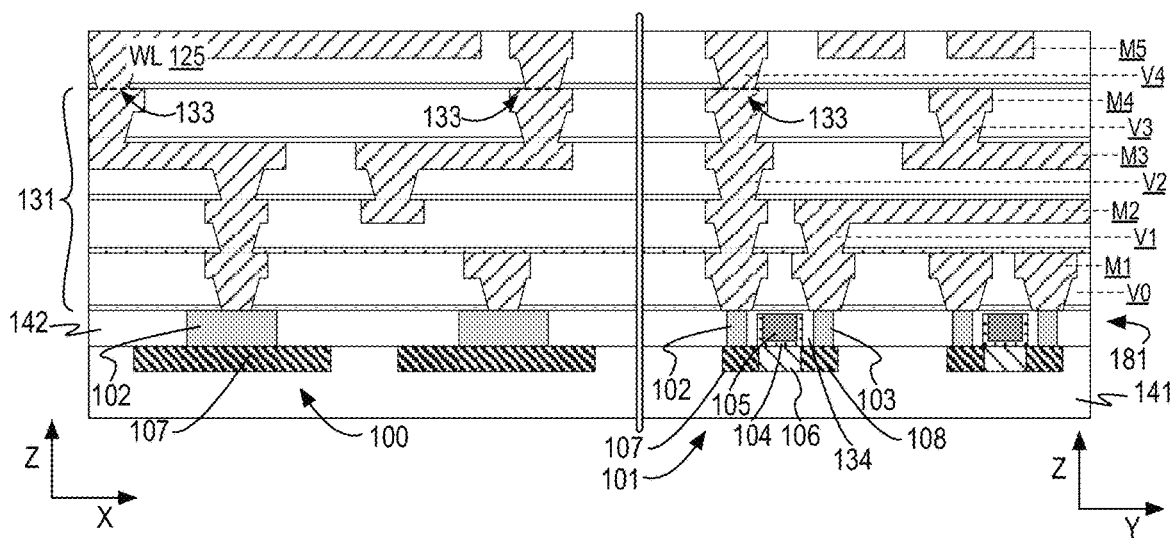

FIG. 8 illustrates a memory structure 800 similar to memory structure 700 after the formation of one or more metallization layers of second metallization layers 132. As discussed, second metallization layers 132 are advantageously predominantly a metal other than tungsten. The one or more metallization layers of second metallization layers 132 may be formed using any suitable technique or techniques such as single or dual damascene techniques or the like. In some embodiments, the one or more metallization layers of second metallization layers 132 are predominantly copper. In some embodiments, the one or more metallization layers of second metallization layers 132 are not less than 90% copper. In some embodiments, the one or more metallization layers of second metallization layers 132 or a fill metal of the one or more metallization layers of second metallization layers 132 (i.e., within a liner, not shown) is not less than 99% copper. The vias corresponding to second metallization layers 132 may be the same materials. Notable, the one or more metallization layers of second metallization layers 132 formed as shown with respect to FIG. 8 may include word line 125, which includes the materials discussed with respect to second metallization layers 132. Furthermore, such change in metals is indicated by interface 133. At interface 133 an alloy of copper and tungsten may be evident. For example, in the y-direction, a relatively thin (e.g., less than 100 nm) region of the metallization may include an alloy of about half tungsten and half copper.

Figure 9:
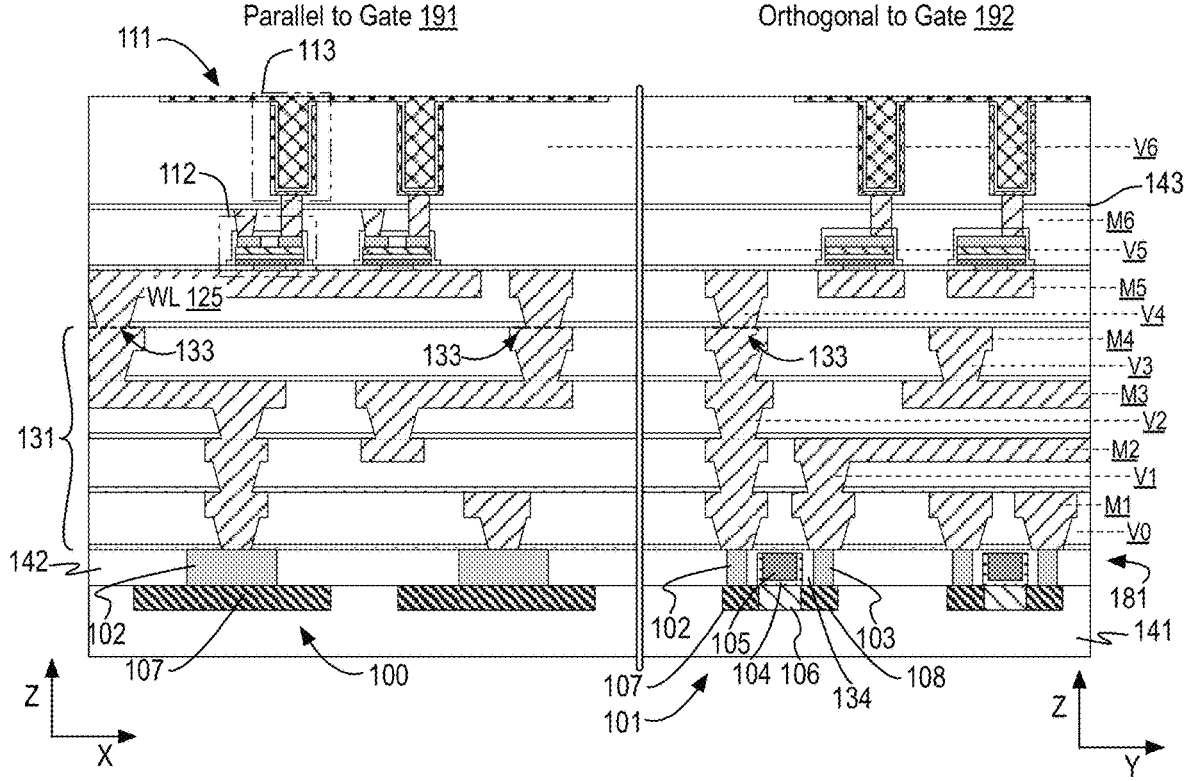

FIG. 9 illustrates a memory structure 900 similar to memory structure 800 after the formation of memory cells 111 such that each includes a select transistor 112 and a capacitor 113. Memory cells 111 may be formed using any suitable technique or techniques such as deposition techniques, patterning (e.g., lithography and etch) techniques, implant techniques, planarization techniques, epitaxial growth techniques, and so on. In the example of FIG. 9, the formation of memory cells 111 also forms V5 and M6 of second metallization layers 132. In other embodiments, the formation of memory cells 111 also forms V6 of second metallization layers 132. Notably, at least a portion of second metallization layers 132 may be fabricated in parallel with respect to the thin film select transistors 112 and MIM capacitors 113 of memory cells 111.

Figure 10:
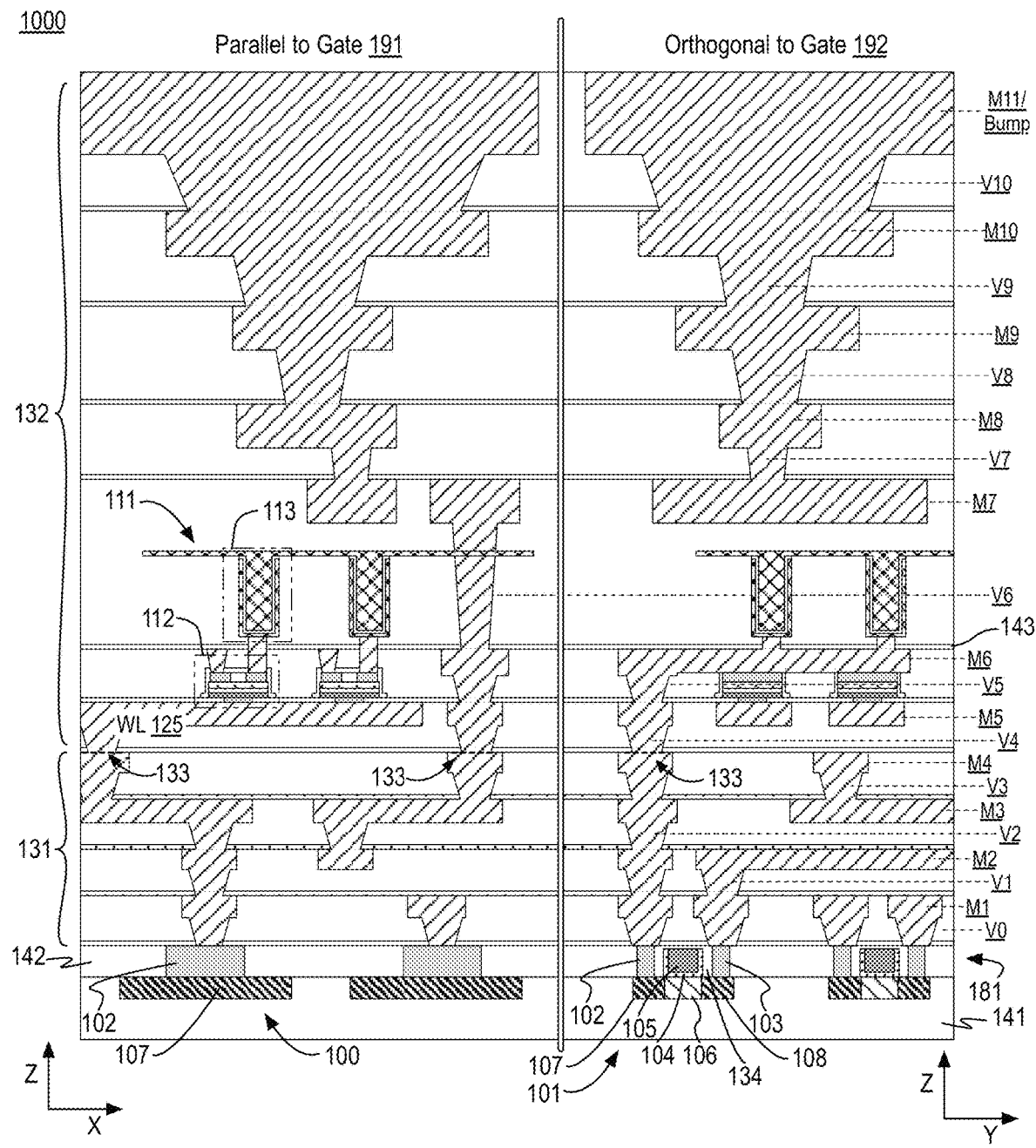

FIG. 10 illustrates a memory structure 1000 similar to memory structure 900 after the formation of the remainder of second metallization layers 132. As discussed, second metallization layers 132 are advantageously predominantly a metal other than tungsten. Second metallization layers 132 may be formed using any suitable technique or techniques such as single or dual damascene techniques or the like. In some embodiments, second metallization layers 132 are predominantly copper. In some embodiments, second metallization layers 132 are not less than 90% copper. In some embodiments, the second metallization layers 132 or a fill metal of second metallization layers 132 (i.e., within a liner, not shown) is not less than 99% copper. The vias corresponding to second metallization layers 132 may be the same materials.

Figure 11:
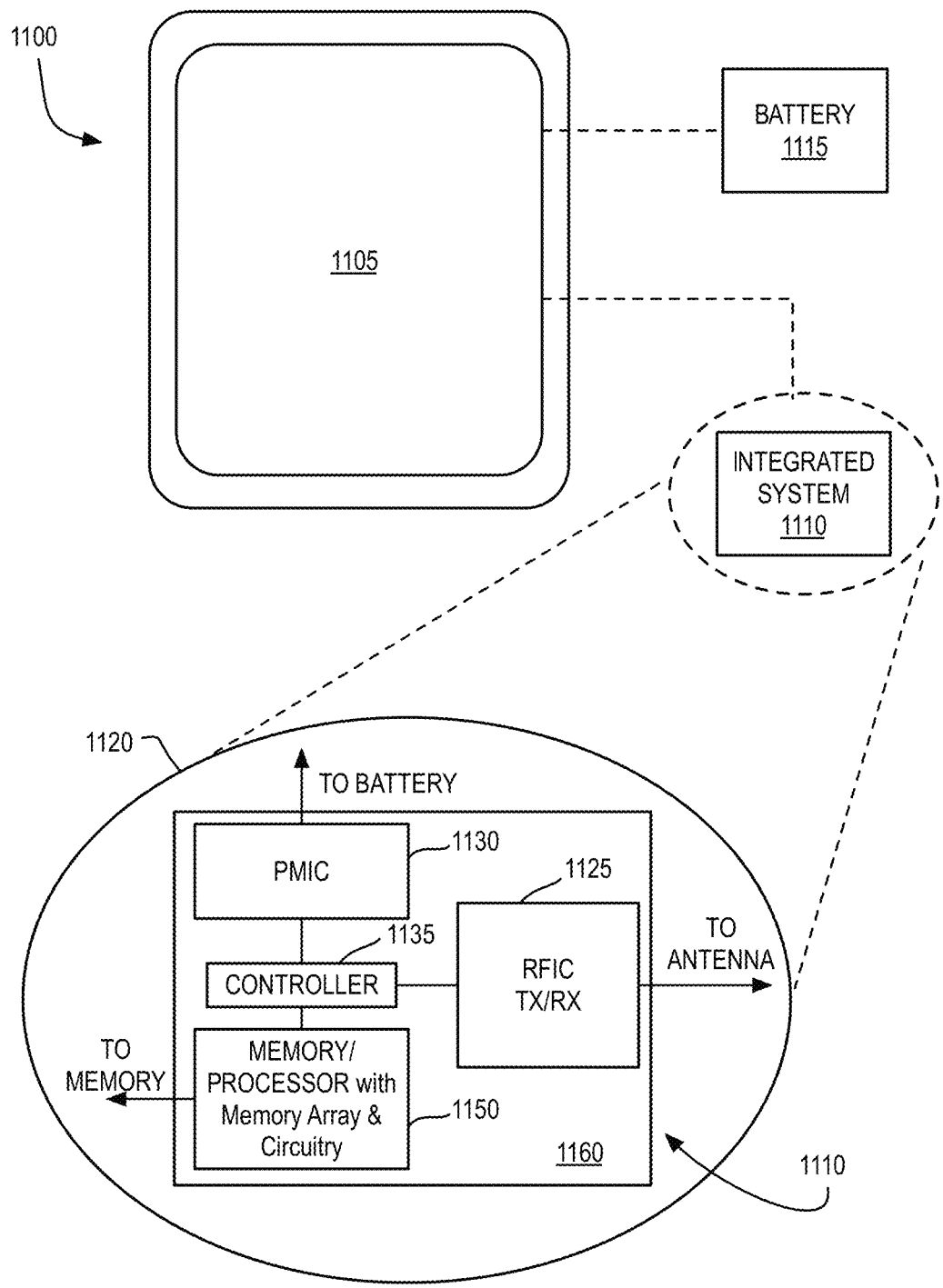
FIG. 11 is an illustrative diagram of a mobile computing platform employing a memory device having integrated high voltage planar transistor support circuitry underlying memory cells having a select transistor and a capacitor.

FIG. 11 is an illustrative diagram of a mobile computing platform 1100 employing a memory device having integrated high voltage planar transistor support circuitry underlying memory cells having a select transistor and a capacitor, arranged in accordance with at least some implementations of the present disclosure. Any die or device having a structure inclusive of any components, materials, or characteristics discussed herein may be implemented by any component of mobile computing platform 1100. For example, one or more of memory devices 100 may be deployed by any component of mobile computing platform 1100. Mobile computing platform 1100 may be any portable device configured for each of electronic data display, electronic data processing, wireless electronic data transmission, or the like. For example, mobile computing platform 1100 may be any of a tablet, a smart phone, a netbook, a laptop computer, etc. and may include a display screen 1105, which in the exemplary embodiment is a touchscreen (e.g., capacitive, inductive, resistive, etc. touchscreen), a chip-level (system on chip—SoC) or package-level integrated system 1110, and a battery 1115. Battery 1115 may include any suitable device for providing electrical power such as a device consisting of one or more electrochemical cells and electrodes to couple to an outside device. Mobile computing platform 1100 may further include a power supply to convert a source power from a source voltage to one or more voltages employed by other devices of mobile computing platform 1100.

Integrated system 1110 is further illustrated in the expanded view 1120. In the exemplary embodiment, packaged device 1150 (labeled "Memory/Processor" in FIG. 11) includes at least one memory chip (e.g., RAM), and/or at least one processor chip (e.g., a microprocessor, a multi-core microprocessor, or graphics processor, or the like). In an embodiment, the package device 1150 is a microprocessor including an SRAM cache memory. As shown, device 1150 may employ a die or device having any transistor structures and/or related characteristics discussed herein. Packaged device 1150 may be further coupled to (e.g., communicatively coupled to) a board, a substrate, or an interposer 1160 along with, one or more of a power management integrated circuit (PMIC) 1130, RF (wireless) integrated circuit (RFIC) 1125 including a wideband RF (wireless) transmitter and/or receiver (TX/RX) (e.g., including a digital baseband and an analog front end module further comprises a power amplifier on a transmit path and a low noise amplifier on a receive path), and a controller 1135 thereof. In general, packaged device 1150 may be also be coupled to (e.g., communicatively coupled to) display screen 1105. As shown, one or both of PMIC 1130 and/or RFIC 1125 may employ a die or device having any transistor structures and/or related characteristics discussed herein.

Functionally, PMIC 1130 may perform battery power regulation, DC-to-DC conversion, etc., and so has an input coupled to battery 1115 and with an output providing a current supply to other functional modules. In an embodiment, PMIC 1130 may perform high voltage operations. As further illustrated, in the exemplary embodiment, RFIC 1125 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 1150 or within a single IC (SoC) coupled to the package substrate of the packaged device 1150.

Figure 12:
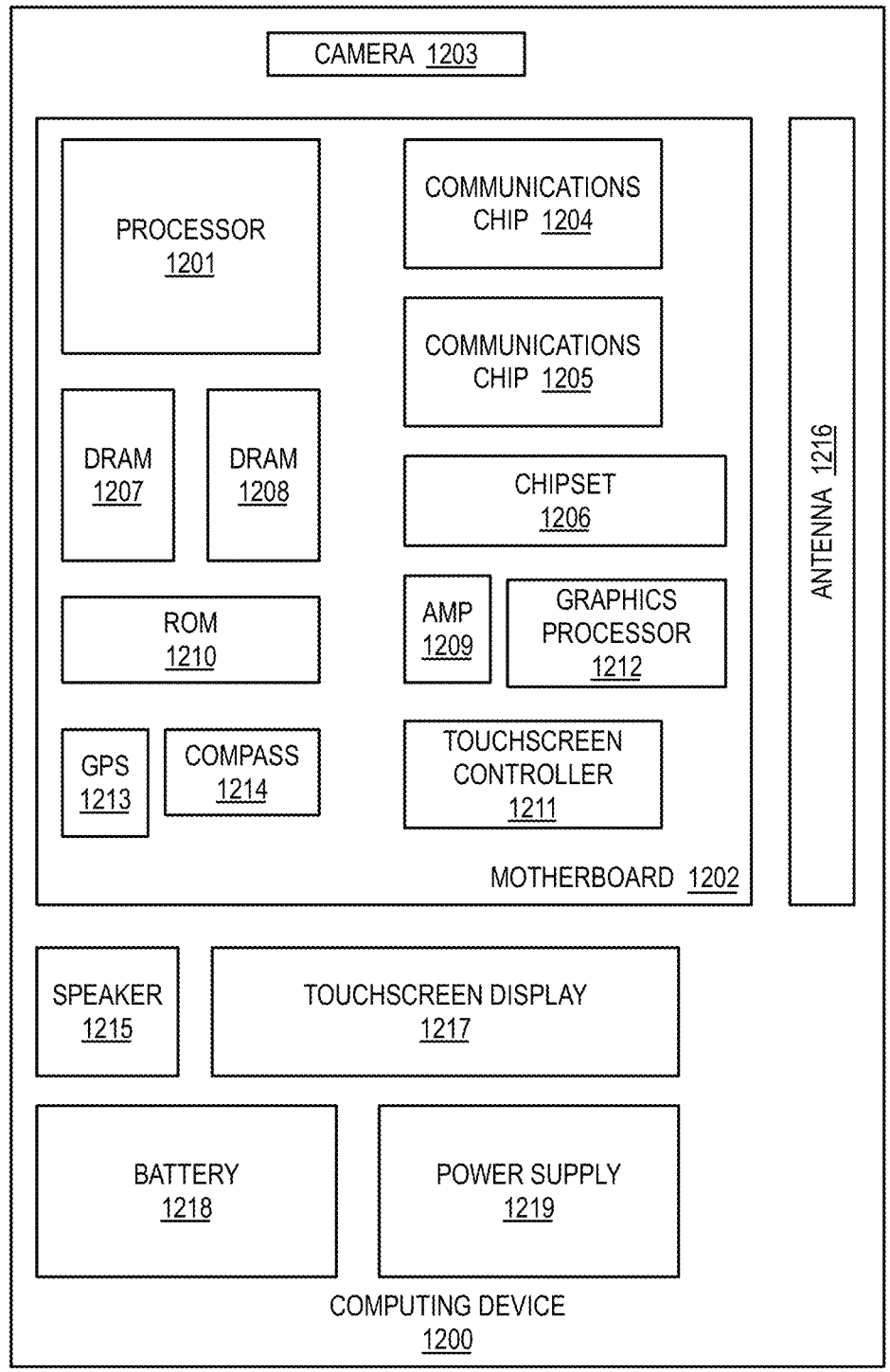
FIG. 12 is a functional block diagram of a computing device, all arranged in accordance with at least some implementations of the present disclosure.

FIG. 12 is a functional block diagram of a computing device 1200, arranged in accordance with at least some implementations of the present disclosure. Computing device 1200 may be found inside platform 1100, for example, and further includes a motherboard 1202 hosting a number of components, such as but not limited to a processor 1201 (e.g., an applications processor) and one or more communications chips 1204, 1205. Processor 1201 may be physically and/or electrically coupled to motherboard 1202. In some examples, processor 1201 includes an integrated circuit die packaged within the processor 1201. In general, the term "processor" may refer to any device or portion of a device that processes electronic data from registers and/or memory to transform that electronic data into other electronic data that may be stored in registers and/or memory. Any one or more device or component of computing device 1200 may include a memory device having integrated high voltage planar transistor support circuitry underlying memory cells having a select transistor and a capacitor with any related characteristics discussed herein.

In various examples, one or more communication chips 1204, 1205 may also be physically and/or electrically coupled to the motherboard 1202. In further implementations, communication chips 1204 may be part of processor 1201. Depending on its applications, computing device 1200 may include other components that may or may not be physically and electrically coupled to motherboard 1202. These other components may include, but are not limited to, volatile memory (e.g., DRAM) 1207, 1208, non-volatile memory (e.g., ROM) 1210, a graphics processor 1212, flash memory, global positioning system (GPS) device 1213, compass 1214, a chipset 1206, an antenna 1216, a power amplifier 1209, a touchscreen controller 1211, a touchscreen display 1217, a speaker 1215, a camera 1203, a battery 1218, and a power supply 1219, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 1204, 1205 may enable wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1204, 1205 may implement any of a number of wireless standards or protocols, including but not limited to those described elsewhere herein. As discussed, computing device 1200 may include a plurality of communication chips 1204, 1205. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. Furthermore, power supply 1219 may convert a source power from a source voltage to one or more voltages employed by other devices of computing device 1200 (or mobile computing platform 1100). In some embodiments, power supply 1219 converts an AC power to DC power. In some embodiments, power supply 1219 converts an DC power to DC power at one or more different (lower) voltages. In some embodiments, multiple power supplies are staged to convert from AC to DC and then from DC at a higher voltage to DC at a lower voltage as specified by components of computing device 1200.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following embodiments pertain to further embodiments.

In one or more first embodiments, an apparatus comprises a planar transistor comprising a channel structure, a gate electrode, and a gate dielectric layer between the channel structure and the gate electrode, the channel structure comprising a material having a band gap of not less than 2 eV, a memory cell over and coupled to the planar transistor, the memory cell comprising a select transistor and a capacitor, a plurality of first metallization layers between the planar transistor and the memory cell, the first metallization layers predominately comprising tungsten, and a plurality second metallization layers over and laterally adjacent the memory cell, the second metallization layers predominately comprising a metal other than tungsten.

In one or more second embodiments, further to the first embodiment, the gate dielectric layer comprises a thickness between the channel structure and the gate electrode of not less than 50 nm.

In one or more third embodiments, further to the first or second embodiments, the gate dielectric layer comprises silicon and oxygen.

In one or more fourth embodiments, further to any of the first through third embodiments, the gate dielectric layer comprises a multilayer stack, the multilayer stack comprising a first layer comprising silicon and oxygen and a second layer comprising one of hafnium or zirconium, and oxygen.

In one or more fifth embodiments, further to any of the first through fourth embodiments, the second metallization layers predominately comprises copper.

In one or more sixth embodiments, further to any of the first through fifth embodiments, the first metallization layers comprise not less than 90% tungsten and the second metallization layers comprise not less than 90% copper.

In one or more seventh embodiments, further to any of the first through sixth embodiments, a first metallization structure of the second metallization layers is between the planar transistor and the select transistor, the first metallization structure comprising a word line coupled to a second gate electrode of the select transistor.

In one or more eighth embodiments, further to any of the first through seventh embodiments, a second metallization structure of the second metallization layers is over the select transistor, the second metallization structure comprising a bit line coupled to a source or drain of the select transistor.

In one or more ninth embodiments, further to any of the first through eighth embodiments, the material of the channel structure comprises gallium and nitrogen, or silicon and carbon.

In one or more tenth embodiments, further to any of the first through ninth embodiments, the first metallization layers comprise not fewer than three metallization layers interconnected by metal vias.

In one or more eleventh embodiments, further to any of the first through tenth embodiments, the channel structure comprises a surface extending laterally between a source and a drain of the planar transistor, the gate electrode interfacing with the channel structure only along the surface of the planar transistor.

In one or more twelfth embodiments, a system comprises a power supply and an integrated circuit die coupled to the power supply, the integrated circuit die comprising an apparatus according to any of the first through eleventh embodiments.

In one or more thirteenth embodiments, a system comprises support circuitry comprising a plurality of planar field effect transistors (FETs), individual ones of the planar FETs comprising a channel structure, a gate electrode, and a gate dielectric layer between the channel structure and the gate electrode, the channel structure comprising gallium and nitrogen, or silicon and carbon, an array of memory cells over and monolithically integrated with the peripheral circuitry via a plurality of metallization layers, individual ones of the memory cells comprising a select transistor and a capacitor, wherein the plurality of metallization layers comprise first metallization layers between the planar FETs and the array of memory cells and second metallization layers over and laterally adjacent the array of memory cells, wherein the first metallization layers predominately comprise tungsten and the second metallization layers predominately comprises copper, and a power supply coupled to the monolithically integrated peripheral circuitry and array of memory cells.

In one or more fourteenth embodiments, further to the thirteenth embodiment, the gate dielectric layer comprises a thickness between the channel structure and the gate electrode of not less than 50 nm, and wherein the gate dielectric layer comprises silicon and oxygen.

In one or more fifteenth embodiments, further to the thirteenth or fourteenth embodiments, the gate dielectric layer comprises a multilayer stack, the multilayer stack comprising a first layer comprising silicon and oxygen and a second layer comprising one of hafnium or zirconium, and oxygen.

In one or more sixteenth embodiments, further to any of the thirteenth through fifteenth embodiments, the first metallization layers comprise not less than 90% tungsten and the second metallization layers comprise not less than 90% copper.

In one or more seventeenth embodiments, further to any of the thirteenth through sixteenth embodiments, a first metallization structure of the second metallization layers is between the planar transistor and the select transistor, the first metallization structure comprising a word line coupled to a second gate electrode of the select transistor.

In one or more eighteenth embodiments, further to any of the thirteenth through seventeenth embodiments, a second metallization structure of the second metallization layers is over the select transistor, the second metallization structure comprising a bit line coupled to a source or drain of the select transistor.

In one or more nineteenth embodiments, further to any of the thirteenth through eighteenth embodiments, the channel structure comprises a surface extending laterally between a source and a drain of the planar transistor, the gate electrode interfacing with the channel structure only along the surface of the planar transistor.

In one or more twentieth embodiments, a method comprises receiving a plurality of planar transistors over a substrate and a plurality of first metallization layers over the planar transistors, wherein individual ones of the planar transistors comprise a channel structure, a gate electrode, and a gate dielectric layer between the channel structure and the gate electrode, the channel structure comprising a material having a band gap of not less than 2 eV, and wherein the first metallization layers predominately comprise tungsten, and forming a memory cell and a plurality of second metallization layers over the first metallization layers, the memory cell comprising a select transistor and a capacitor and the second metallization layers over and laterally adjacent the memory cell, wherein the second metallization layers predominately comprise copper.

In one or more twenty-first embodiments, further to the twentieth embodiment, the gate dielectric layer comprises a thickness between the channel structure and the gate electrode of not less than 50 nm and not more than 1,000 nm.

In one or more twenty-second embodiments, further to the twentieth or twenty-first embodiments, the gate dielectric layer comprises silicon and oxygen and the material of the channel structure comprises gallium, indium, or aluminum and nitrogen.

In one or more twenty-third embodiments, further to any of the twentieth through twenty-second embodiments, the first metallization layers comprise not less than 90% tungsten and the second metallization layers comprise not less than 90% copper.

In one or more twenty-fourth embodiments, further to any of the twentieth through twenty-third embodiments, a first metallization structure of the second metallization layers is between the planar transistor and the select transistor, the first metallization structure comprising a word line coupled to a second gate electrode of the select transistor and wherein a second metallization structure of the second metallization layers is over the select transistor, the second metallization structure comprising a bit line coupled to a source or drain of the select transistor.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An apparatus, comprising:
   a planar transistor comprising a gallium nitride channel structure, a gate electrode, and a gate dielectric layer between the gallium nitride channel structure and the gate electrode, the gallium nitride channel structure having a band gap of not less than 3 eV;
   a memory cell over and coupled to the planar transistor, the memory cell comprising a select transistor and a capacitor;
   a plurality of first metallization layers between the planar transistor and the memory cell, the first metallization layers predominately comprising tungsten; and
   a plurality second metallization layers over and laterally adjacent the memory cell, the second metallization layers predominately comprising a metal other than tungsten.

2. The apparatus of claim 1, wherein the gate dielectric layer comprises a thickness between the gallium nitride channel structure and the gate electrode of not less than 50 nm, and wherein the gate dielectric layer comprises silicon and oxygen.

3. The apparatus of claim 1, wherein the gate dielectric layer comprises a multilayer stack, the multilayer stack comprising a first layer comprising silicon and oxygen and a second layer comprising oxygen and one of hafnium or zirconium.

4. The apparatus of claim 1, wherein the first metallization layers comprise not less than 90% tungsten and the second metallization layers comprise not less than 90% copper.

5. The apparatus of claim 1, wherein a first metallization structure of the second metallization layers is between the planar transistor and the select transistor, the first metallization structure comprising a word line coupled to a second gate electrode of the select transistor.

6. The apparatus of claim 5, wherein a second metallization structure of the second metallization layers is over the select transistor, the second metallization structure comprising a bit line coupled to a source or drain of the select transistor.

7. The apparatus of claim 1, wherein the gallium nitride channel structure comprises a surface extending laterally between a source and a drain of the planar transistor, the gate electrode interfacing with the gallium nitride channel structure only along the surface of the planar transistor.

8. The apparatus of claim 1, further comprising:
   a power supply coupled to the planar transistor and/or the memory cell.

9. An apparatus, comprising:
   support circuitry comprising a plurality of planar field effect transistors (FETs), individual ones of the planar FETs comprising a gallium nitride channel structure or a silicon carbide channel structure, a gate electrode, and a gate dielectric layer between the gallium nitride channel structure or the silicon carbide channel structure and the gate electrode; and
   an array of memory cells over and monolithically integrated with the support circuitry via a plurality of metallization layers, individual ones of the memory cells comprising a select transistor and a capacitor, wherein the plurality of metallization layers comprise first metallization layers between the planar FETs and the array of memory cells and second metallization layers over and laterally adjacent the array of memory cells, wherein the first metallization layers predominately comprise tungsten and the second metallization layers predominately comprises copper.

10. The apparatus of claim 9, wherein the gate dielectric layer comprises a thickness between the gallium nitride channel structure or the silicon carbide channel structure and the gate electrode of not less than 50 nm, and wherein the gate dielectric layer comprises silicon and oxygen.

11. The apparatus of claim 9, wherein the gate dielectric layer comprises a multilayer stack, the multilayer stack comprising a first layer comprising silicon and oxygen and a second layer comprising oxygen and one of hafnium or zirconium.

12. The apparatus of claim 9, wherein the first metallization layers comprise not less than 90% tungsten and the second metallization layers comprise not less than 90% copper.

13. The apparatus of claim 9, wherein a first metallization structure of the second metallization layers is between a first of the planar FETs and a first select transistor, the first metallization structure comprising a word line coupled to a second gate electrode of the first select transistor.

14. The apparatus of claim 13, wherein a second metallization structure of the second metallization layers is over the first select transistor, the second metallization structure comprising a bit line coupled to a source or drain of the first select transistor.

15. The apparatus of claim 9, wherein the gallium nitride channel structure or the silicon carbide channel structure comprises a surface extending laterally between a source and a drain of each of the planar FETs, the gate electrode interfacing with the gallium nitride channel structure or the silicon carbide channel structure only along the surface.

16. The apparatus of claim 9, further comprising:
   a power supply coupled to the planar FETs and/or the array of memory cells.

17. An apparatus, comprising:
   a planar transistor comprising a silicon carbide channel structure, a gate electrode, and a gate dielectric layer between the silicon carbide channel structure and the gate electrode, the silicon carbide channel structure having a band gap of not less than 3 eV;
   a memory cell over and coupled to the planar transistor, the memory cell comprising a select transistor and a capacitor;
   a plurality of first metallization layers between the planar transistor and the memory cell, the first metallization layers predominately comprising tungsten; and
   a plurality second metallization layers over and laterally adjacent the memory cell, the second metallization layers predominately comprising a metal other than tungsten.

18. The apparatus of claim 17, wherein the gate dielectric layer comprises a thickness between the silicon carbide channel structure and the gate electrode of not less than 50 nm, and wherein the gate dielectric layer comprises silicon and oxygen.

19. The apparatus of claim 17, wherein the gate dielectric layer comprises a multilayer stack, the multilayer stack comprising a first layer comprising silicon and oxygen and a second layer comprising oxygen and one of hafnium or zirconium.

20. The apparatus of claim 17, wherein the first metallization layers comprise not less than 90% tungsten and the second metallization layers comprise not less than 90% copper.

21. The apparatus of claim 17, wherein a first metallization structure of the second metallization layers is between the planar transistor and the select transistor, the first metallization structure comprising a word line coupled to a second gate electrode of the select transistor, and wherein a second metallization structure of the second metallization layers is over the select transistor, the second metallization structure comprising a bit line coupled to a source or drain of the select transistor.

22. The apparatus of claim 17, wherein the silicon carbide channel structure comprises a surface extending laterally between a source and a drain of the planar transistor, the gate electrode interfacing with the silicon carbide channel structure only along the surface of the planar transistor.

23. The apparatus of claim 17, further comprising:
a power supply coupled to the planar transistor and/or the memory cell.

* * * * *